United States Patent [19]

Rosenkranz

[11] 4,262,082
[45] Apr. 14, 1981

[54] POSITIVE ELECTRON BEAM RESISTS

[75] Inventor: Hans J. Rosenkranz, Krefeld, Fed. Rep. of Germany

[73] Assignee: Bayer Aktiengesellschaft, Leverkusen, Fed. Rep. of Germany

[21] Appl. No.: 74,139

[22] Filed: Sep. 7, 1979

[30] Foreign Application Priority Data

Sep. 13, 1978 [DE] Fed. Rep. of Germany ....... 2839751

[51] Int. Cl.³ .............................................. G03C 5/00
[52] U.S. Cl. ...................................... 430/296; 430/942; 430/270; 430/285; 430/906; 430/907; 430/908; 430/910
[58] Field of Search ............... 430/270, 285, 910, 907, 430/908, 942, 296, 906; 526/292; 204/159.22

[56] References Cited

U.S. PATENT DOCUMENTS

| | | | |
|---|---|---|---|
| 3,162,613 | 12/1964 | Tousignant | 526/292 |
| 3,210,326 | 10/1965 | Tousignant et al. | 526/292 |
| 3,833,384 | 9/1974 | Noonan et al. | 430/910 |
| 4,011,351 | 3/1977 | Gipstein et al. | 430/296 |
| 4,052,527 | 10/1977 | Pastor et al. | 204/159.22 |
| 4,129,708 | 12/1978 | Mino et al. | 526/292 |

Primary Examiner—Won H. Louie, Jr.
Attorney, Agent, or Firm—Connolly and Hutz

[57] ABSTRACT

A positive electron beam resist lacquer binder which comprises polymerized or copolymerized units of: (A) 0 to 95 mol-% of at least one alkyl ester of methacrylic acid having from 1 to 20 carbon atoms in the alkyl moiety; (B) 5 to 100 mol-% of at least one monomer corresponding to Formula (I)

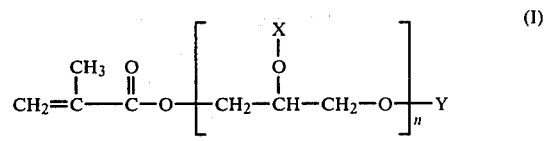

wherein n is zero or one and one of the groups, X and Y is always a hydrogen atom and X or Y denotes a phenyl or naphthyl group substituted by at least one halogen atom, or a phenyl or naphthyl group substituted by at least one alkyl group having from 1 to 8 carbon atoms, alkoxy group having from 1 to 8 carbon atoms, carboxyl group, cyano group, carboxyalkyl group having from 1 to 4 carbon atoms in the alkyl moiety, or alkylcarbonyl group having from 1 to 8 carbon atoms in the alkyl moiety, provided that when n is one, at least one of X or Y is a hydrogen atom and the other of X or Y; if not a hydrogen atom, is as hereinbefore defined or a halogenoalkylcarbonyl group having from 1 to 4 carbon atoms in the alkyl moiety or a halogen acrylcarbonyl group; (C) 0 to 30 mol-% of an $\alpha,\beta$-monoolefinically unsaturated carboxylic acid having from 3 to 5 carbon atoms; (D) 0 to 40 mol-% of acrylamide, methacrylamide or an N-mono- or N-di-alkyl ester thereof having from 1 to 8 carbon atoms in the or each alkyl moiety; and (E) 0 to 70 mol-% of styrene, $\alpha$-methylstyrene, acrylonitrile, methacrylonitrile, vinyl acetate, vinyl propionate vinyl chloride, vinylidene chloride, a vinyl alkyl ether having from 1 to 8 carbon atoms in the alkyl moiety, an allyl acetate, maleic imide, maleic acid, or mixtures thereof; the sum of all of the molar percentages of components A, B, C, D, and E being 100.

9 Claims, No Drawings

POSITIVE ELECTRON BEAM RESISTS

The present invention relates to special polymers of polymerised units of α,β-monoolefinically unsaturated monomers which are degraded by the action of electron beams and which may, therefore, be used as positively functioning electron beam resists, and a process for forming a layer of such a polymer on a substrate.

Positively functioning resist systems are nowadays indispensible for many of the operating processes used in the electronics industry. These types of systems are generally mixture of novolak resins and certain diazo components which are sensitive to UV-light and which change their solubility properties on exposure to light in such a manner that the exposed parts of any film made therefrom can be removed from a substrate to which it is applied, with an aqueous alkali. Because of their high power of resolution, the above products have also attained considerable importance in microelectronics.

The ever increasing miniaturisation in the field of electronics has however led to the idea of using electron beams instead of UV light for the transfer of circuit images to the corresponding carriers because their shorter wavelengths gives them a higher resolution.

Whilst numerous negatively functioning photoresist lacquers can be cross-linked by electron beams, the use of positively functioning photoresists which are sensitive to UV light has not provided any useful results when used with electron beams.

Numerous polymers have been disclosed in the literature which, when a layer thereof is exposed to high energy radiation, undergo a molecular weight degradation and thereby change their solubility properties to such an extent that, when they are used with certain solvent mixtures, it is possible to differentiate between the irradiated and non-irradiated areas of such a polymer layer. Polyolefin sulphones and polyhexylisocyanates have been mentioned in this connection as well as polymethlmethylmethacrylate and polymethylisopropenylketone. A survey of the field of radiation sensitive polymers has been given, for example, by W. Moreau and N. Viswanathan in the monograph "Ultraviolet Light Induced Reactions in Polymers", ACS Symposium Series 25, Washington D.C. 1976, page 107.

One critical factor in deciding upon the use of such electron beam sensitive polymers as positively functioning resist lacquers is that the degradation in molecular weight caused by such high energy radiation must be accompanied by a drastic change in the solubility properties thereof, because only in that case is it possible to dissolve the irradiated parts of a layer without damaging the untouched zones, or wearing them down to such an extent that they no longer provide resistance to the next following operating stage, which is generally an etching process. Any developments in this particular field must therefore be aimed at finding polymers which show the greatest possible difference in solubility between the unirradiated form and the form which has been degraded by irradiation.

The present invention relates to positively functioning electron beam resists with particularly advantageous properties, and which consist essentially of (co)-polymerised units of halogenated, α,β-monoolefinically unsaturated monomers as film formers. The products described in more detail herein below undergo a drastic change in solubility even when exposed to only small doses of radiation so that they can easily be developed with pure solvents.

The present invention therefore provides positive electron beam resist lacquer binders comprising (co) polymerised units of (A) 0 to 95 mol % of at least one $C_1$ to $C_{20}$-alkylester of methacrylic acid;

(B) 5 to 100 mol % of at least one monomer corresponding to formula (I)

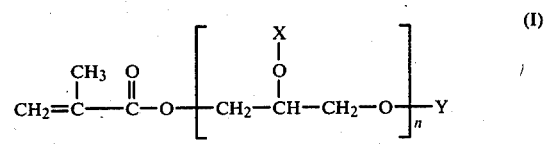

wherein n=0 or 1, one of the groups X or Y is always hydrogen when n=1, and X or Y denotes a phenyl or napthyl group substitued by at least one halogen atom (fluorine, chloring, bromine) or a phenyl or naphthyl group substitued by at least one group selected from $C_1$ to $C_8$ alkyl, $C_1$ to $C_8$ alkoxy, carboxyl, cyano, carboxyalkyl with 1 to 4 C-atoms in the alky group, or $C_1$ to $C_8$ alkylcarbonyl (=CO-alkyl); or when n=1, X or Y denotes a halogenalkylcarbonyl group having 1 to 4 C-atoms in the alkyl residue or halogenarlycarbonyl group (phenyl, naphthyl), (C) 0 to 30 mol % of an α,β-monoolefinically unsaturated carboxylic acid having 3 to 5 C-atoms, (D) 0 to 40 mol % of acrylamide, methacrylamide or N-monoalkylated dialkylated ($C_1$ to $C_8$) (meth)acrylamide and (E) 0 to 70 mol % of styrene, α-methylstyrene, acrylonitrile, methacrylontrile, vinyl acetate, vinyl propionate, vinyl chloride, vinylidene chloride, a vinyl alkyl ether having 1-8 C-atoms in the alkyl group, an allylacetate, maleic imide, maleic anhydride, maleic acid, or mixtures thereof. the sum of all the percentages of components (A), (B), (C), (D), and (E) being 100. The electron beam resist lacquer binder perferably comprises (co)polymerised units of monomers (A)+(B). In formula (I) above X is preferably a hydrogen atom and, when n=0 or 1, Y is preferably a group corresponding to one of the folowing formulae:

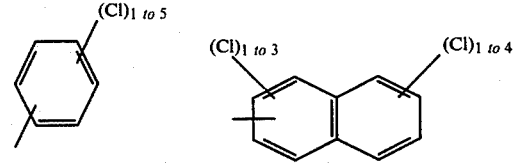

or when n=1, a group of the formula $Cl_3$—C—CO—.

Among it the monomers (A), the following are preferred: Methacrylic acid alkyl esters having from 1 to 12 C atoms in the alcohol component, such as methyl methacrylate, ethyl methacrylate, propyl methacrylate, butyl methacrylate and dodecyl methacrylate.

Monomers (B) of formula (I) wherein N=0 may be prepared, for example, by methods given in "Organicum", publishers VEB-Deutshe Verlag der Wissenschaften, Berlin 1973, page 446.

The following are examples: Methacrylic acid-p-chlorophenyl ester, methacrylic acid-3,4-dichlorophenyl ester, methacrylic acid-3,4,5-trichlorophenyl ester, methacrylic acid 2,3,4,5,6-pentachlorophenyl ester and methacrylic acid-3-chloro-4-methoxyphenyl ester.

Monomers (B) of formula (I) wherein $n=1$, may be prepared by the chemical addition of partially or completely halogenated phenols, partially or completely halogenated phenol derivatives, or halogenated carboxylic acids to glycidyl methacrylate. This addition may be carried out at temperatures below 100° C. with the aid of catalysts such as tertiary amines, alkali metal hydroxides, bis-(hydroxyalkyl)sulphides, sulphonium or phosphonium compounds, phosphines, arsines or stibines.

The lacquer binders according to the present invention having the composition described above may also be obtained if, when polymerising the monomers, glycidyl methacrylate, for example, is first (co)polymerised in the desired quantity instead of component (B) (formula (I) $n=1$), and the polymer obtained after this polymerisation is reacted with the quantity of halogen substituted phenol, halogen alkyl carboxylic acid or halogen aryl carboxylic acid which is equivalent to the glycidyl groups.

Alternatively, a copolymer containing methacrylic acid units may be prepared and then reacted with, for example, the glycidyl ether of a halogenated phenol.

The polymers forming the basis of the resist systems according to the present invention may be produced by radical polymerisation of the monomers in solution, in mass, in suspension or in emulsion by known methods. The usual initiators such as peroxides, azo compounds or redox systems may be used for this purpose. Polymerisation may also be initiated by light in the presence of suitable photo initiators.

Molecular weitht reducing additives may be added during the polymerisation in quantities of from 0.01 to 5 mol %, based on the total quantity of monomers used. Additives of this kind include, for example, n-butyl mercaptan, tert. -and n-dodecyl mercaptan, ethylene glycol dimercaptoacetate, pentaerythritol trimercaptoacetate, thioglycol, thioglycerol, thioglycolic acid and carbon tetrachloride.

The polymers of the present invention are solid, soluble resins having a preferred average molecular weight $\overline{M}n$ in the range of from 5000 to 500,000.

If the polymers of the present invention have been prepared using monomers of type (B) containing halogen atoms, they may be dissolved in the usual lacquer solvents and then applied to the required substrates in this form so that they constitute the resist film after solvent removal.

In cases where a polymer has first been prepared from monomers of type (A) and glycidyl methacrylate the resin obtained may be reacted with halogen-containing components such as p-chlorophenol, 3,4-dichlorophenol, 3,4,5-trichlorophenol, 2,3,4,5,6-pentachlorophenol or 3-chloro-4-methoxyphenol or with halogenated carboxylic acids such as trichloroacetic acid or dichloro -or pentachloro benzoic acid. The aforementioned catalysts which accelerate the addition reactions with epoxy compounds may also be used for this particular reaction. It is advisable to carry out the addition reactions with an excess of halogen compound, and any unreacted halogen compounds can easily be removed by the method of polymer precipitation as it is generally employed for the purification of vinyl polymers.

A typical polymer for the purpose of the present invention may therefore be prepared as follows: A methacrylic acid alkyl ester and glycidyl methacrylate are dissolved in equal parts in a usual solvent for vinyl polymerisation, and polymerised with the aid of an organic peroxide. The resulting resin solution is treated with an excess, based on the glycidyl methacrylate of, for example, pentachlorophenol and is then heated under reflux until an analytical determination no longer shows any epoxy groups. The polymer solution is then purified by precipitation by stirring it into a solvent in which it is insoluble. For its use as a resist material, the precipitated polymer is again dissolved and then, if necessary, filtered. It is then ready for use.

For practical application, the resist binder according to the present invention may generally contain other conventional constituents in addition to the polymer and a suitable solvent, for example other resins, such as polymers and polycondensates, may be added. Moreover, sensitizers or initiators and particularly dyes may also be added.

Virtually any solvents in which the polymers according to the present invention are readily soluble may be used for producing the resist layer. Chlorinated hydrocarbons, higher alcohols, esters and aromatic hydrocarbons are, for example, suitable for this purpose.

The substrates used may be, for example, any of the materials used in the electronics industry, such as metal foils of copper, aluminium, zinc, magnesium or steel and carrier surfaces, e.g., of silicon for the production of semiconductors. Layers of virtually any thickness can be produced on these substrates, depending upon the concentration of the polymer solution. In the field of micro electronics, layer thicknesses of less than 5 $\mu$m are used in order to obtain good reproduction of even the finest details.

The resist systems according to the present invention are preferably exposed to electron beams, of which very small doses ranging from $10^{-6}$ to $10^{-3}$ Coulomb/cm$^2$ are sufficient. Electron beams with an energy of from 10,000 to 100,000 eV are normally used. Other exceptionally high energy radiation(X-rays, $\gamma$-rays) may in principle also be used, but electron beam radiation is preferred.

After irradiation and the consequent degradation of the resist layer, "development" may be carried out with a solvent. Which solvents are particularly suitable for this purpose depends mainly on the composition of the polymer. Optimum solvents for the different polymers can easily be found by simple tests. Aromatic hydrocarbons, chlorinated hydrocarbons or esters are generally suitable. If the polymers contain a polymerised unsaturated acid such as acrylic or methacrylic acid, development may also be carried out using an aqueous alkali, and a 1 to 2% by weight sodium carbonate solution is generally used in such cases.

A conventional dye may be added to the resist system to enhance testing of the quality of the resist layers or of the developed coating on the carrier material. Virtually any dyes which are soluble in organic solvents as well as organic and inorganic dye pigments may be used.

The substrates with resist films which have been developed imagewise are generally etched or else they are coated with metals by electroplating (e.g. for the production of printed circuits). The coatings according to the present invention are distinguished by their exceptional resistance under such conditions. In addition, they adhere firmly, and are capable of reproducing the finest details and structures. After etching or electroplating, the resist film can be removed from the substrate with suitable solvents. Simple tests may be carried out to determine suitable solvents; these include, for example, dimthylformamide, halogenated hydrocarbons and in some cases organic acids and aqueous alkalis.

The resist systems according to the present invention are suitable for the production of integrated electronic components and for the production of relief images and printing forms for relief, intaglio or flat printing, e.g. for offset printing, screen printing and the production of lithographic printing plates and half-tone etching.

The percentages given in the following illustrative Examples are based on percentages by weight.

EXAMPLE 1

30 ml of butyl acetate was heated to boiling under a stream of nitrogen in a 250 ml three-necked flask equipped with a reflux condenser, a stirrer and a dropping funnel. A mixture of 20.2 g (0.2 mol) of methylmethacrylate, 13.6 g (0.04 mol) of methacrylic acid pentachlorophenyl ester and 0.7 g (2%) of benzoyl peroxide dissolved in 50 ml of butyl acetate was then added dropwise during one hour. A solution of 0.4 g (1%) of benzoyl peroxide in 10 ml of butyl acetate was then added dropwise during a further hour with continued boiling. After a further hour of boiling under reflux, the polymer solution obtained was concentrated by evaporation, dissolved in methylene chloride, filtered, and then precipitated in petroleum ether. The dry polymer had a chlorine content of 20.6% (theoretical=20.9% Cl).

The polymer was redissolved in a mixture of methylene chloride and methyl glycol acetate and applied as a ca. 3 $\mu$m layer to a copper laminated polyester foil. A piece of this foil measuring 2×2 cm was introduced into an electron microscope where a part of its surface was exposed to an electron beam of 20,000 eV energy and a current intensity of 50 mA until it had received a dose of $4 \times 10^{-6}$ Coulomb/cm$^2$. The irradiated piece of foil was then "developed" with ethanol. In the parts of the foil which had been exposed to the electron beam, the polymer layer could be removed simply by rinsing with ethanol. The unexposed parts of the resist lacquer layer were not damaged by this solvent. During subsequent etching in iron-III chloride solution, the unexposed polymer film proved to be absolutely resistant. The copper in the areas which had been freed from polymer film could be completely removed without any damage to the unexposed zones.

EXAMPLE 2

A polymer was prepared in an analogous fashion to Example 1 from 4.5 g (0.045 mol) of methyl methacrylate 10.2 g (0.03 mol) of methacrylic acid pentachlorophenyl ester and 0.45 g (4%) of benzoyl peroxide in a total of 30 ml of butyl acetate and it was then purified by precipitation from petroleum ether.

A thin film of this polymer was degraded under the conditions of irradiation indicated in Example 1 so that the exposed areas of the film could be dissolved with ethanol.

EXAMPLE 3

A polymer was prepared in an analogous fashion to Example 1 from 3.75 g (0.0375 mol) of methyl methacrylate, 1.27 g (0.0375 mol) of methacrylic acid pentachlorophenylester and 0.49 g (3%) of benzoyl peroxide in a total of 20 ml of toluene, and it was then purified by precipitation from petroleum ether.

After exposure to a radiation dose of $2 \times 10^{-6}$ Coulomb/cm$^2$ imder the conditions indicated in Example 1, a thin film of this polymer could easily be dissolved with ethanol.

EXAMPLE 4

A polymer was prepared in an analogous fashion as in Example 1 from 1.5 g (0.015 mol) of methyl methacrylate 20.3 g (0.06 mol) of methacrylic acid pentachlorophenyl ester and 0.66 g (3%) of benzoyl peroxide in a total of 45 ml of toluene and it was then purified by precipitation from petroleum ether.

A thin film of this polymer was exposed to a radiation dose of $5 \times 10^{-5}$ Coulomb/cm$^2$ under the conditions indicated in Example 1. In this case the exposed parts of the polymer layer could also easily be removed with ethanol.

EXAMPLE 5

Using the apparatus described in Example 1, a mixture of 21.3 g (0.15 mole) of glycidyl methacrylate, 35 g. (0.35 mol) of methyl methacrylate and 1.1 g (2%) of benzoyl peroxide dissolved in 65 g of butyl acetate was polymerised at reflux temperature under a stream of nitrogen. The reaction was left to continue for 2 hours, during which time a further 0.55 g (1%) of benzoyl peroxide in 15 g of butyl acetate was added dropwise. 133 g (0.5 mol) of pentachlorophenol were then added to the resulting resin solution. The solution was subsequently heated under reflux for 4 days and the mixture was finally separated out by precipitating it twice from petroleum ether. The purified polymer was found to have a chlorine content of 42.3% (theoretical; 46.8% Cl).

This polymer was also dissolved in a mixture of methylene chloride and methyl glycol acetate and applied as an approximately 3 $\mu$m layer to a copper laminated polyester foil. It was then exposed to electron beams in an electron microscope as described in Example 1 and the minimum dose of radiation required was determined. It was found that it could easily be developed with toluene after exposure to a dose of $5 \times 10^{-6}$ Coulomb/cm$^2$.

EXAMPLE 6

A polymer was prepared in a fashion analogous to that of Example 5 from 21.3 g (0.15 mol) of glycidylmethacrylate, 35 g (0.35 mol) of methyl methacrylate and 1.65 g (3%) of benzoyl peroxide in a total of 80 g of butyl acetate. The polymer was heated under reflux for 3 days together with 81.7 g (0.5 mol) of trichloroacetic acid. The polymer resin was found to have a chlorine content of 32% (theoretical=37.5% Cl).

When irradiation was carried out as in Example 1, a dose of $5 \times 10^{-4}$ Coulomb/cm$^2$ altered the solubility of the layer sufficiently to enable it to be developed with toluene.

EXAMPLE 7

The polymer containing glycidyl methacrylate obtained in Example 5 or Example 6 was in this case reacted with 3-chloro-4-methoxyphenol. A radiation dose of $8 \times 10^{-4}$ Coulomb/cm$^2$ produced a change in the solubility of the polymer which enabled it to be developed with ethanol.

EXAMPLE 8

The polymer containing glycidyl methacrylate from Example 5 or Example 6 was reacted with 3,4-dichlorophenol and then purifified by precipitation.

A radiation dose of $5 \times 10^{-4}$ Coulomb/cm$^2$ produced a sufficient change in its solubility to enable it to be developed with toluene.

I claim:

1. In the method of producing a positive resist image comprising the step of
   (a) exposing a portion of a film of polymeric material to electron beam radiation until the exposed area experiences a degradation in molecular weight resulting in a change of solubility and
   (b) removing the degraded polymer of the exposed area by dissolution with a solvent,
   the improvement comprises said polymeric material being polymerized or copolymerized units of
   (A) 0 to 95 mol % of at least one alkyl ester of methacrylic acid having from 1 to 20 carbon atoms in the alkyl moiety;
   (B) 5 to 100 mol % of at least one monomer corresponding to the formula

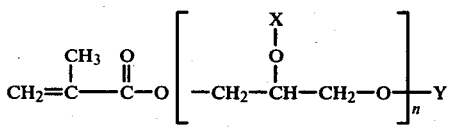

wherein n is zero or one and one of X and Y is always hydrogen and X or Y is phenyl or napthyl substituted by at least one halogen, or phenyl or napthyl substituted by at least one alkyl having from 1 to 8 carbon atoms, alkoxy having from 1 to 8 carbon atoms, carboxyl, cyano, carboxyalkyl having from 1 to 4 carbon atoms in the alkyl moiety, or alkylcarbonyl having from 1 to 8 carbon atoms in the alkyl moiety provided that when n is one, at least one of X or Y is hydrogen and the other of X or Y, if not a hydrogen atom, is as hereinbefore defined or a halogenoalkylcarbonyl having from 1 to 4 carbon atoms in the alkyl moiety or a halogen acrylcarbonyl;
   (C) 0 to 30 mol % of an α,β-monoolefinically unsaturated carboxylic acid having from 3 to 5 carbon atoms;
   (D) 0 to 40 mol % of acrylamide, methacrylamide or an N-mono- or N-di-alkyl ester thereof having from 1 to 8 carbon atoms in each alkyl moiety; and
   (E) 0 to 70 mol % of styrene, α-methylstyrene, acrylonitrile, methacrylonitrile, vinyl acetate, vinyl propionate, vinyl chloride, vinylidene chloride, a vinyl alkyl ether having from 1 to 8 carbon atoms in the alkyl moiety, an allyl acetate, maleic imide, maleic anhydride, maleic acid, or mixtures thereof;
   with the sum of all of the molar percentages of components (A), (B), (C), (D), and (E) being 100.

2. The process according to claim 1 wherein said polymeric material has an average molecular weight of from about 5,000 to 5000,000.

3. The process according to claim 1 wherein X is hydrogen.

4. The process according to claim 1 wherein Y is

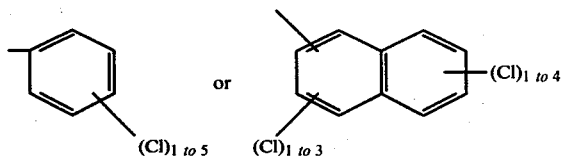

5. The process according to claim 1 wherein n is one and Y is -CO-C—Cl$_3$.

6. The process according to claim 1 wherein component (B) is selected from the group consisting of methacrylic acid-p-chlorophenyl ester, methacrylic acid-3,4,5-trichlorophenyl ester, methacrylic acid-2,3,4,5,6-pentachlorophenyl ester and methacrylic acid-4-methoxy-5-chlorophenyl ester.

7. The process according to claim 1 wherein component (A) is a methacrylic acid-alkyl ester wherein the alkyl moiety has from 1 to 12 carbon atoms.

8. The process according to claim 7 wherein component (A) is methyl, ethyl, propyl, butyl or dodecyl methacrylate.

9. The process according to claim 1 wherein said polymeric material consists of components (A) and (B).

* * * * *